United States Patent
Markov et al.

(10) Patent No.: US 12,014,793 B2
(45) Date of Patent: Jun. 18, 2024

(54) METHOD OF SCREENING NON-VOLATILE MEMORY CELLS

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 208 days.

(21) Appl. No.: 17/858,185

(22) Filed: Jul. 6, 2022

(65) Prior Publication Data
US 2023/0335212 A1    Oct. 19, 2023

Related U.S. Application Data

(60) Provisional application No. 63/330,650, filed on Apr. 13, 2022.

(51) Int. Cl.
| | | |
|---|---|---|
| *G11C 16/34* | (2006.01) | |
| *G11C 16/14* | (2006.01) | |
| *G11C 16/26* | (2006.01) | |
| *G11C 29/50* | (2006.01) | |

(52) U.S. Cl.
CPC ........ *G11C 29/50016* (2013.01); *G11C 16/14* (2013.01); *G11C 16/26* (2013.01); *G11C 16/349* (2013.01); *G11C 29/50004* (2013.01); *G11C 2029/5004* (2013.01); *G11C 2029/5006* (2013.01)

(58) Field of Classification Search
CPC ...................................................... G11C 16/34
USPC ..................................................... 365/185.22
See application file for complete search history.

(56) References Cited

U.S. PATENT DOCUMENTS

| | | | |
|---|---|---|---|
| 5,596,528 | A | 1/1997 | Kaya |
| 8,576,648 | B2 | 11/2013 | Markov et al. |
| 2003/0074152 | A1 | 4/2003 | Kessenich |
| 2005/0018481 | A1 | 1/2005 | Guterman |
| 2008/0268659 | A1 | 10/2008 | Wu |
| 2019/0164617 | A1* | 5/2019 | Tran ............. G11C 11/54 |
| 2020/0160933 | A1 | 5/2020 | Sun |
| 2021/0398602 | A1 | 12/2021 | Lakshminarayana |

OTHER PUBLICATIONS

PCT Search Report and Written Opinion dated Nov. 18, 2022 corresponding to the related PCT Patent Application No. PCT/US2022/037228.
Taiwanese Office Action mailed on Mar. 12, 2024 corresponding to the related Taiwanese Patent Application No. 112109903.

* cited by examiner

*Primary Examiner* — Jason Lappas
(74) *Attorney, Agent, or Firm* — DLA Piper LLP (US)

(57) ABSTRACT

A method for screening memory cells includes erasing the memory cells, weakly programming the memory cells to a modified erased state, performing a first read operation on the memory cells after the erasing and the weakly programming, screening any of the memory cells that exhibit a read current during the first read operation below a margin read current threshold M1, baking the memory cells after the first read operation, performing a second read operation on the memory cells after the baking, and screening any of the memory cells that exhibit a read current during the second read operation below the margin read current threshold M1.

9 Claims, 14 Drawing Sheets

METHOD OF SCREENING NON-VOLATILE MEMORY CELLS

RELATED APPLICATIONS

This application claims the benefit of U.S. Provisional Application No. 63/330,650, filed Apr. 13, 2022, and which is incorporated herein by reference.

FIELD OF THE INVENTION

The present disclosure relates to a method of screening non-volatile memory cells for data retention.

BACKGROUND OF THE INVENTION

Non-volatile memory cells having a floating gate for the storage of charges thereon are well known in the art. Referring to FIG. 1, there is shown a cross-sectional view of a conventional non-volatile memory cell 10. The memory cell 10 comprises a semiconductor substrate 12, of a first conductivity type, such as P type. At or near a surface of the substrate 12 is a first region 14 (also referred to herein as drain or drain region) of a second conductivity type, such as N type. Spaced apart from the first region 14 is a second region 16 (also referred to herein as source or source region) also of the second conductivity type. The portion of the substrate 10 between the first region 14 and the second region 16 is a channel region 18. A word line gate (also referred to herein as a select gate) 20, which can be made of polysilicon is positioned over a first portion of the channel region 18. The word line gate 20 is spaced apart from the channel region 18 by an insulating layer 22 (e.g., silicon dioxide). Immediately adjacent to and spaced apart from the word line gate 20 is a floating gate 24, which can also be made of polysilicon, and is positioned over another portion of the channel region 18. The floating gate 24 is separated from the channel region 18 by another insulating layer 30 (e.g., silicon dioxide). A control gate (also referred to as a coupling gate) 26, which can also be made of polysilicon is positioned over the floating gate 24 and is insulated therefrom by another insulating layer 32 (such that any voltage applied to the control gate 26 is capacitively coupled to the floating gate 24). On another side of the floating gate 24, and spaced apart therefrom, is an erase gate 28, which also can be made of polysilicon. The erase gate 28 is positioned over the second region 16 and is insulated therefrom. The erase gate 28 is also immediately adjacent to but spaced apart from the control gate 26. In the operation of the memory cell 10, charges stored on the floating gate 24 (or the absence of charges on the floating gate 24) control the flow of current between the first region 14 and the second region 16 through channel region 18. Where the floating gate 24 has charge (i.e., electrons) thereon (i.e., the floating gate is negatively charged), the floating gate 24 is deemed to be programmed. Where the floating gate 24 mostly free of electron charges thereon (i.e., the floating gate is considered positively charged), the floating gate 24 is deemed to erased. The charge state of the floating gate 24 controls the conductivity of that portion of the channel region 18 underneath the floating gate 24, and the voltage applied to the word line gate 20 controls the conductivity of that portion of the channel region 18 underneath the word line gate 20.

The memory cell 10 operates as follows. During a programming operation, in which (electrons) charge are stored onto the floating gate 24, a first positive voltage is applied to the word line gate 20 causing the portion of the channel region 18 under the word line gate 20 to be conductive. A second positive voltage is applied to the control gate 26. A third positive voltage is applied to the second region 16. Current is applied to the first region 14. The electrons are attracted to the positive voltage at the second region 16. As they near the floating gate 24, they experience a sudden increase in the electric field caused by the voltage applied to the control gate 26 which is capacitively coupled to the floating gate 24, causing the charges to be injected onto the floating gate 24. Thus, programming occurs through the mechanism of hot electron injection.

During an erase operation in which (electron) charges are removed from the floating gate 24, a high positive voltage is applied to the erase gate 28. A negative voltage or ground voltage can be applied to the control gate 26, the word line gate 20 or both. Charges are transferred from the floating gate 24 to the erase gate 28 by tunneling through the insulating layer between the floating gate 24 and the erase gate 28. In particular, the floating gate 24 may be formed with a sharp tip facing the erase gate 28, thereby facilitating Fowler-Nordheim tunneling of electrons from the tip on the floating gate 24, through the insulating layer between the floating gate 24 and the erase gate 28, and onto the erase gate 28.

During a read operation, a first positive voltage is applied to the word line gate 20 to turn on the portion of the channel region 18 beneath the word line gate 20. A second positive voltage is applied to the control gate 26. A voltage differential is applied to the first region 14 and the second region 16. If the floating gate 24 is programmed, i.e. the floating gate 24 stores electrons, then the second positive voltage applied to the control gate 26 is not able to overcome the negative potential induced by electrons stored on the floating gate 24 and therefore the portion of the channel region 18 beneath the floating gate 24 remains non-conductive. Thus, no current or a minimal amount of current flows between the first region 14 and the second region 16. This is sensed as a programmed (i.e., 0) state. However, if the floating gate 24 is erased, i.e. the floating gate 24 is considered positively charged, then the second positive voltage applied to the control gate 26 (which is capacitively coupled to the floating gate 24) is able to cause the portion of the channel region 18 beneath the floating gate 24 to be conductive. Thus, a current flows between the first region 14 and the second region 16. This is sensed as an erased (i.e., 1) state.

Memory cells 10 are typically formed in an array, having a plurality of rows and columns of memory cells 10, on a semiconductor wafer. After the memory cells 10 are fabricated on a wafer, the memory cells 10 on the wafer are subject to a test to determine the ability of each memory cell 10 to retain its programmed or erased state, in particular, the ability of the floating gate 24 in each memory cell 10 to retain its charge state in terms of electrons or mostly the lack thereof. During testing, the memory cell 10 is first programmed, to place charge (electrons) on the floating gate 24, or erased, to mostly remove charge (electrons) from the floating gate 24. The memory cells 10 are then baked which involves subjecting the memory cells 10 to a high temperature for a certain time period (as a non-limiting example, three days at 250 degrees Celsius). Finally, each memory cell 10 in the device is subject to a read operation in which the read current from the memory cell 10 under test is compared to a read reference current.

Referring to FIG. 2, there is shown a graph of a standard deviation of a read current Ir distribution of various memory cells 10 set at different program states, i.e. at different amounts of charge on the respective floating gate 24. The memory cells 10 in the erased state typically have a higher read current 40 compared to the read current 42 for memory cells in the neutral charge state (i.e., with some charge on the floating gates), which in turn typically have a higher read current compared to the read current 44 for memory cells in the programmed state (i.e., fully programmed with electrons on the floating gate). During normal use operation of the memory cells, the determination of the memory cell program state is conducted by performing a read operation and comparing the read current of the memory cell Ir (i.e., the current through the channel region 18 when the normal use operation read voltages are applied) with a read reference current. A non-limiting example of the read reference current is approximate 30% of the typical read current of an erased memory cell. If the read current is above the read reference current, the memory cell is considered erased. If the read current is below the read reference current, the memory cell is considered programmed. Due to dispersion of parameters of cells integrated in a memory array, the read current 42 of some cells in the neutral charge state can be higher than the read reference current, and the read current 42 of some cells can be lower than the read reference current.

In the event the memory cell 10 has a leakage path for charges through dielectrics surrounding floating gate 24, the read current from such a defective memory cell 10 in an erased state would decrease (as electrons leak onto the floating gate) and tend to have the characteristics of current 42. This condition cannot be detected after a high temperature bake if the read current from the defective memory cell 10 under test remains above the read reference current. Similarly, the read current from a defective memory cell 10 in a programmed state would increase (as electrons leak off of the floating gate) and tend to have the characteristics of current 42. This condition cannot be detected after a high temperature bake if the read current from a defective memory cell 10 under test remains below the read reference current.

Due to these characteristics of the non-volatile memory cell 10, testing of a memory device with memory cells 10 of the prior art have involved two operations. In a first operation, a first data pattern is stored in the memory cells followed by a first baking operation, followed by a testing operation to determine the read currents of the memory cells 10 and compare them to the read reference current. In a second operation, a second data pattern, which is a mutually inverse pattern of the first data pattern, is stored in the memory cells, followed by a second baking operation, followed by a testing operation to determine the read currents of the memory cells 10 and compare them to the read reference current. Because the time to store the data pattern in the memory cells and the time to bake the device is considerable, this has increased the cost of testing memory devices. Even with the two-baking process of the prior art, however, some defective memory cells 10 may go undetected as defective after the data retention screening (i.e. testing to identify memory cells that are defective for failure to adequately maintain their programmed state for storing data). For example, a defective memory cell 10 can have a read current 42 above the read reference current. In the first test, when the defective memory cell 10 is in the erased state except for electrons that have leaked onto the floating gate, the read current from such a memory cell would decrease due to the leakage and yet tend to have the characteristics of current 42, so that its read current remains above the read reference current, and the defective cell 10 would not be detected as defective. In the second test, when the defective cell 10 is in the programmed state except for electrons that have leaked off of the floating gate, the read current from such a cell would increase due to the leakage and yet tend to have the characteristics of the read current 42. However, if leakage is too slow during the bake process, the read current from the defective cell 10 would not have time to increase above the read reference current during the baking process. Therefore, because the read reference current is typically close to the read current 42, electron leakage during baking process is typically slow and some defective cells 10 may remain undetected as defective after data retention screening.

There is a need for improving the efficiency of the data retention screening process for defective memory cells.

BRIEF SUMMARY OF THE INVENTION

The aforementioned problems and needs are addressed by a method for screening memory cells that includes erasing the memory cells, weakly programming the memory cells to a modified erased state, performing a first read operation on the memory cells after the erasing and the weakly programming, screening any of the memory cells that exhibit a read current during the first read operation below a margin read current threshold M1, baking the memory cells after the first read operation, performing a second read operation on the memory cells after the baking, and screening any of the memory cells that exhibit a read current during the second read operation below the margin read current threshold M1.

A method for screening memory cells includes erasing the memory cells, weakly programming the memory cells to a modified erased state, performing a first read operation on the memory cells after the erasing and the weakly programming, screening any of the memory cells that exhibit a read current during the first read operation below a margin read current threshold M1, baking the memory cells after the first read operation, performing a second read operation on the memory cells after the baking, and screening any of the memory cells that exhibit a read current during the second read operation below a margin read current threshold M2. The margin read current thresholds M1 and M2 are greater than a read reference current used to determine an erased state of the memory cells during a nominal read operation, and the margin read current threshold M2 is less than the margin read current threshold M1.

A method for screening memory cells includes strongly erasing the memory cells wherein each of the memory cells includes a control gate, performing a first read operation on the memory cells, after the strongly erasing, that includes applying a first read voltage to the control gates that is below a nominal read voltage for the control gates, screening any of the memory cells that exhibit a read current during the first read operation below a margin read current threshold M1, weakly programming the memory cells to a modified erased state, performing a second read operation on the memory cells, after the weakly programming, that includes applying a second read voltage to the control gates that is below a nominal read voltage for the control gates and greater than the first read voltage, screening any of the memory cells that exhibit a read current during the second read operation below the margin read current threshold M1, baking the memory cells after the second read operation, performing a third read operation on the memory cells, after the baking, that includes applying a third read voltage to the control gates that is below the nominal read voltage for the control gates and greater than the second read voltage, and screening any of the memory cells that exhibit a read current during the third read operation below the margin read current threshold M1.

A method for screening memory cells that includes strongly erasing the memory cells, wherein each of the memory cells includes a control gate, performing a first read operation on the memory cells, after the strongly erasing, that includes applying a first read voltage to the control gates that is below a nominal read voltage for the control gates, screening any of the memory cells that exhibit a read current during the first read operation below a margin read current threshold M1, weakly programming the memory cells to a modified erased state, performing a second read operation on the memory cells, after the weakly programming, that includes applying a second read voltage to the control gates that is below a nominal read voltage for the control gates and greater than the first read voltage, screening any of the memory cells that exhibit a read current during the second read operation below a margin read current threshold M2, baking the memory cells after the second read operation, performing a third read operation on the memory cells, after the baking, that includes applying a third read voltage to the control gates that is below the nominal read voltage for the control gates and greater than the second read voltage, and screening any of the memory cells that exhibit a read current during the third read operation below a margin read current threshold M3. The margin read current thresholds M1, M2 and M3 are greater than a read reference current used to determine an erased state of the memory cells during a nominal read operation, the margin read current threshold M3 is less than the margin read current threshold M2, and the margin read current threshold M2 is less than the margin read current threshold M1.

Other objects and features of the present disclosure will become apparent by a review of the specification, claims and appended figures.

DETAILED DESCRIPTION OF THE INVENTION

Figure 1:
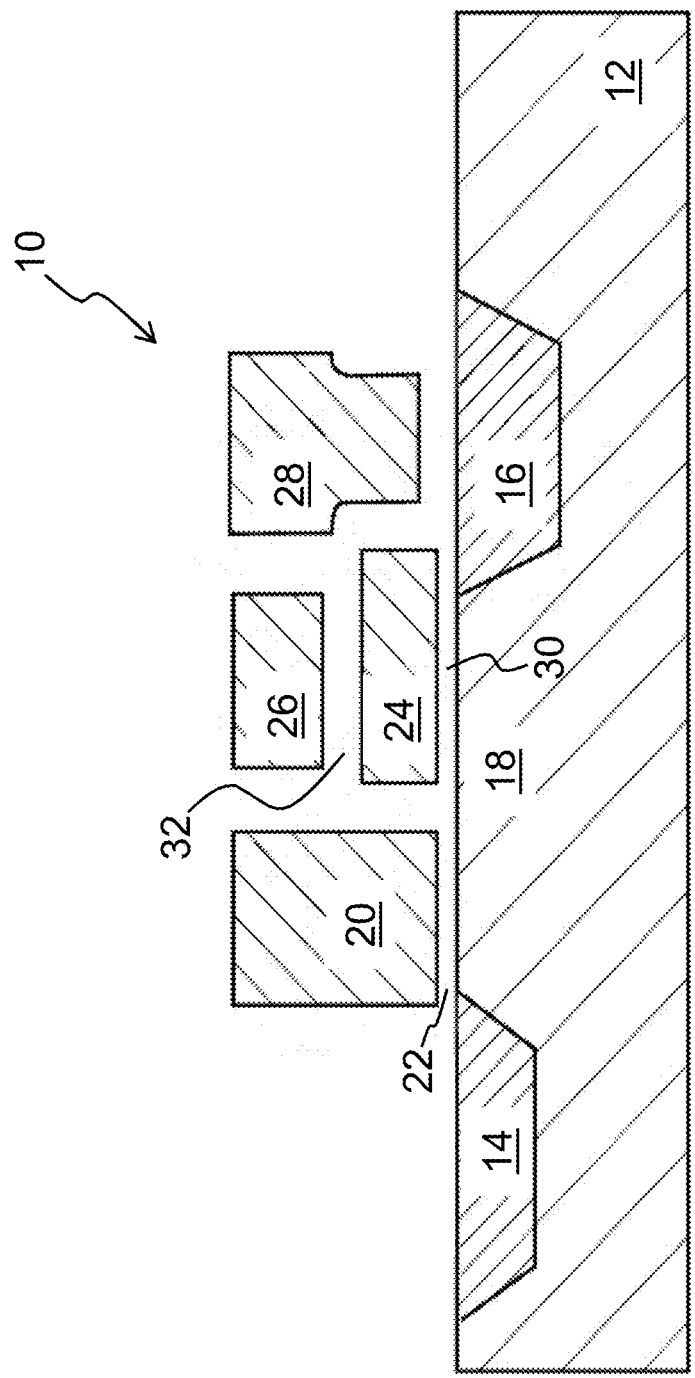
FIG. 1 is a side cross sectional view of a conventional non-volatile memory cell.
Figure 2:
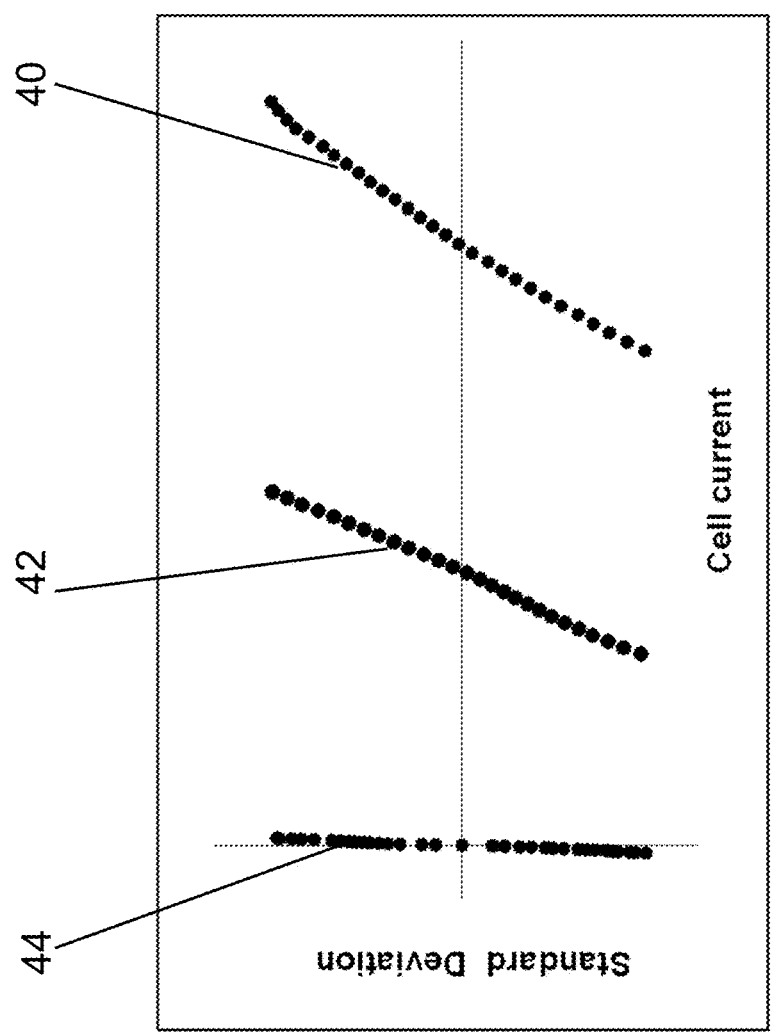
FIG. 2 is a graph showing the distributions of read currents of erased memory cells, memory cells in a neutral charge state, and programmed memory cells.

It has been determined by the inventors that 0-to-1 failures (in which electrons leak off the floating gate) for the memory cells of FIG. 1 are encountered more often than 1-to-0 failures (in which electrons leak onto the floating gate) after a high temperature bake operation. This means that baking memory cells in the programmed '0' state is more efficient for data retention screening (i.e., detection of leaky defective memory cells that fail to adequately maintain program state over time) than baking the memory cells in the erased '1' state. The cell current of memory cells at the neutral charge state (which is the end stop for a leaky bit) was found to be mostly higher than the read reference current, therefore, getting closer to the erased state rather than to the program state. Because of this, data retention screening to detect an excessively leaky and therefore defective memory cell from the programmed '0' state using a read operation with a margin read current threshold set closer to the programmed '0' state (referred to herein as Margin 0) than the read reference current can be more efficient compared to data retention screening from the erased '1' state using a read operation with a margin read current threshold set closer to erased '1' state (referred to herein as Margin 1, and margin read current threshold M1). Another reason why data retention screening from the programmed '0' state can be more efficient is that the erase distribution (i.e., the distribution of read currents and threshold voltages for erased memory cells) is substantially wider compared to the program distribution (i.e., the distribution of read currents and threshold voltages for programmed memory cells) due to the less controllable Fowler Nordheim tunneling mechanism used for erase, while programming is based on the more controllable hot electron injection mechanism. Leaky defective memory cells are usually normal otherwise, meaning that they likely originate from the central portion of the erase or program read current distributions. Therefore, a wider erase or program read current distribution requires a margin read current threshold used for data retention screening to detect leaky memory cells to be set further away from the distribution, which results in a longer time for leaky memory cells to be detected because leaks occur over time. Said another way, on rare occasions, leaky memory cells can see a change in charge state from the erased '1' state faster compared to the programmed '0' state due to the strongly asymmetrical nature of the leakage. There is a need to improve data retention screening efficiency.

Figure 3:
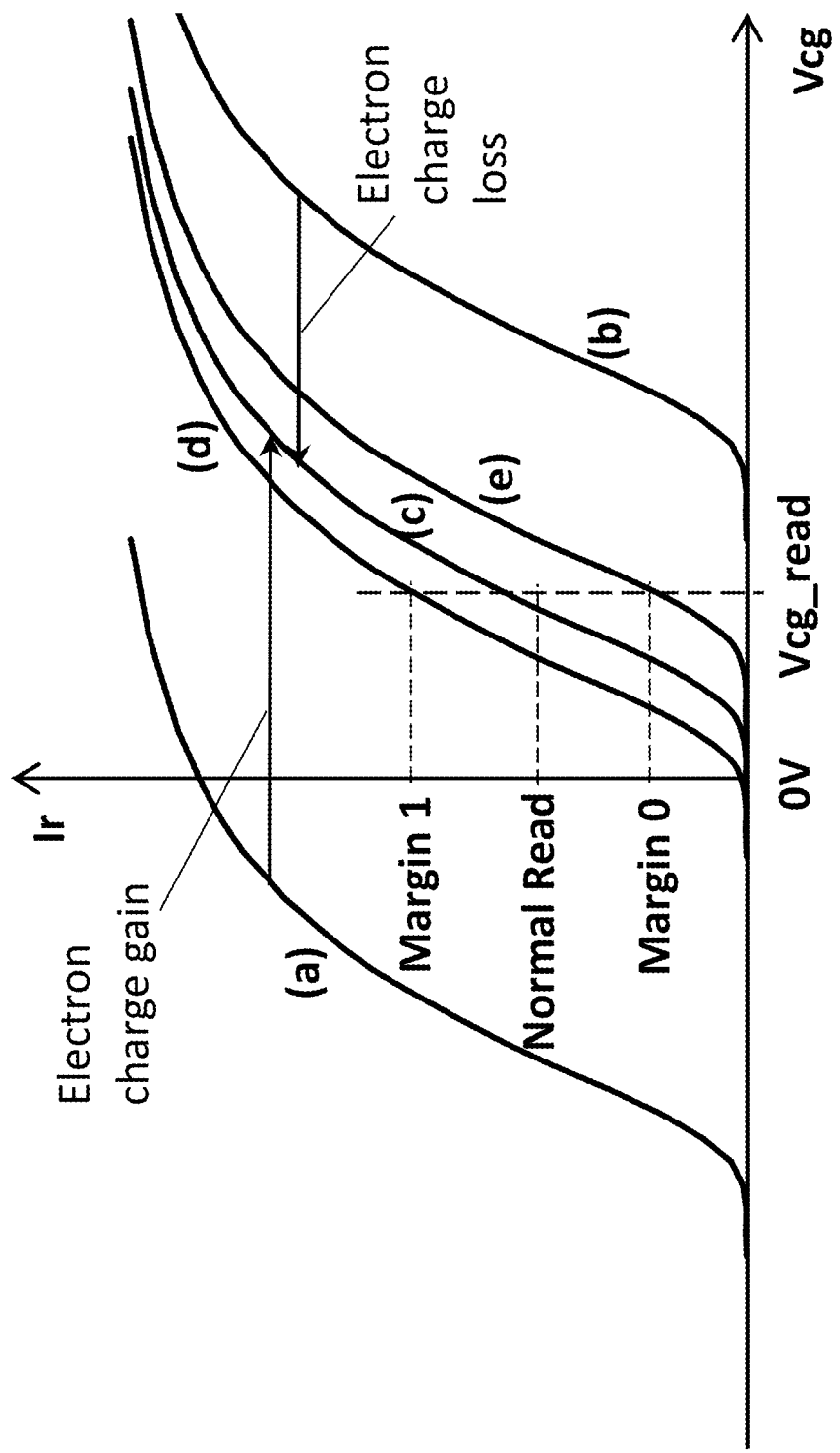
FIG. 3 is a graph showing distributions of read currents as a function of control gate voltage for memory cells in different program states.

Dependence of memory cell read current Ir on the read voltage Vcg applied to the control gate 26 (CG) for the memory cell of FIG. 1 under otherwise normal use read operation conditions for various cell states is illustrated in FIG. 3. The curves in FIG. 3 illustrate the read current characteristics of a leaky memory cell as a function of the read voltage Vcg applied to the control gate. Specifically, curve (a) corresponds to a memory cell right after the erase operation is applied (i.e., the erased memory cell has a positive floating gate charge (positive Qfg)). Curve (b) corresponds to a memory cell right after the program operation is applied (i.e., the programmed memory cell has a negative floating gate charge (negative Qfg)). Curve (c) corresponds to the neutral charge state of the floating gate (zero floating gate charge (Qfg=0)). Curves (d) and (e) correspond to failure detection thresholds for read current used for data retention screening for the erased state '1' and programmed state '0' respectively. For example, if the read current characteristic curve of an erased memory cell shifts from curve (a) to the right beyond curve (d) (i.e., due to floating gate charge leaking toward the neutral charge state), it would be deemed defective. Likewise, if the read current characteristic curve of a programmed memory cell shifts from curve (b) to the left beyond curve (e) (i.e., due to floating gate charge loss), it would be deemed defective.

Any change in programming state of the floating gate (i.e., its charge state) results in a corresponding shift of the characteristic curve along the Vcg axis without changing the shape of the curve. In general, the floating gate charge (Qfg) for a leaky memory cell moves to its neutral charge state under non-biased conditions. Therefore, read current Ir of the memory cell increases over the time during the bake process if the memory cell begins in the programmed '0' state (indicated by the "electron charge loss" arrow) and decreases during the bake process if the memory cell begins in the erased '1' state (indicated by the "electron charge gain" arrow), both approaching the neutral charge state (Qfg=0), as illustrated in FIG. 3. Data retention failure can be detected more efficiently using the Margin 1 reference current and the Margin 0 reference current set accordingly above and below the Normal Read reference current. Specifically, "Normal Read" in FIG. 3 represents the read reference current during a nominal read operation (including using the nominal read voltage Vcg_read on the control gate) that demarks whether the memory cell is erased or programmed. As used herein, nominal read, nominal program and nominal erase operations, including the nominal voltages applied during these nominal operations, refer to the read, program and erase operations performed on the memory cells to read, program and erase data in/to/from the memory cells during normal use conditions of a memory device containing the memory cells under the control of a controller that manages read, program and erase operations. Margin 1 represents a margin read current threshold (which is above the read reference current by a predetermined amount), and is a read current threshold below which an erased memory cell is considered defective. Similarly, Margin 0 represents a margin read current threshold (which is below the read reference current by a predetermined amount), and is a read current threshold above which a programmed memory cell is considered defective. Data retention efficiency can be improved by reducing time-to-failure for leaky memory cells by setting Margin 0 below, and Margin 1 above, the read reference current (used for nominal read operations). An additional way to reduce time-to-failure for leaky memory cells is to, during the read operation, apply a voltage to the control gate that is higher than the nominal read voltage Vcg_read used for nominal read operations for data retention screening memory cells in the programmed "0" state, and apply a voltage to the control gate that is lower than the nominal read voltage Vcg_read used for nominal read operations for data retention screening memory cells in the erased '1' state.

Figure 4:
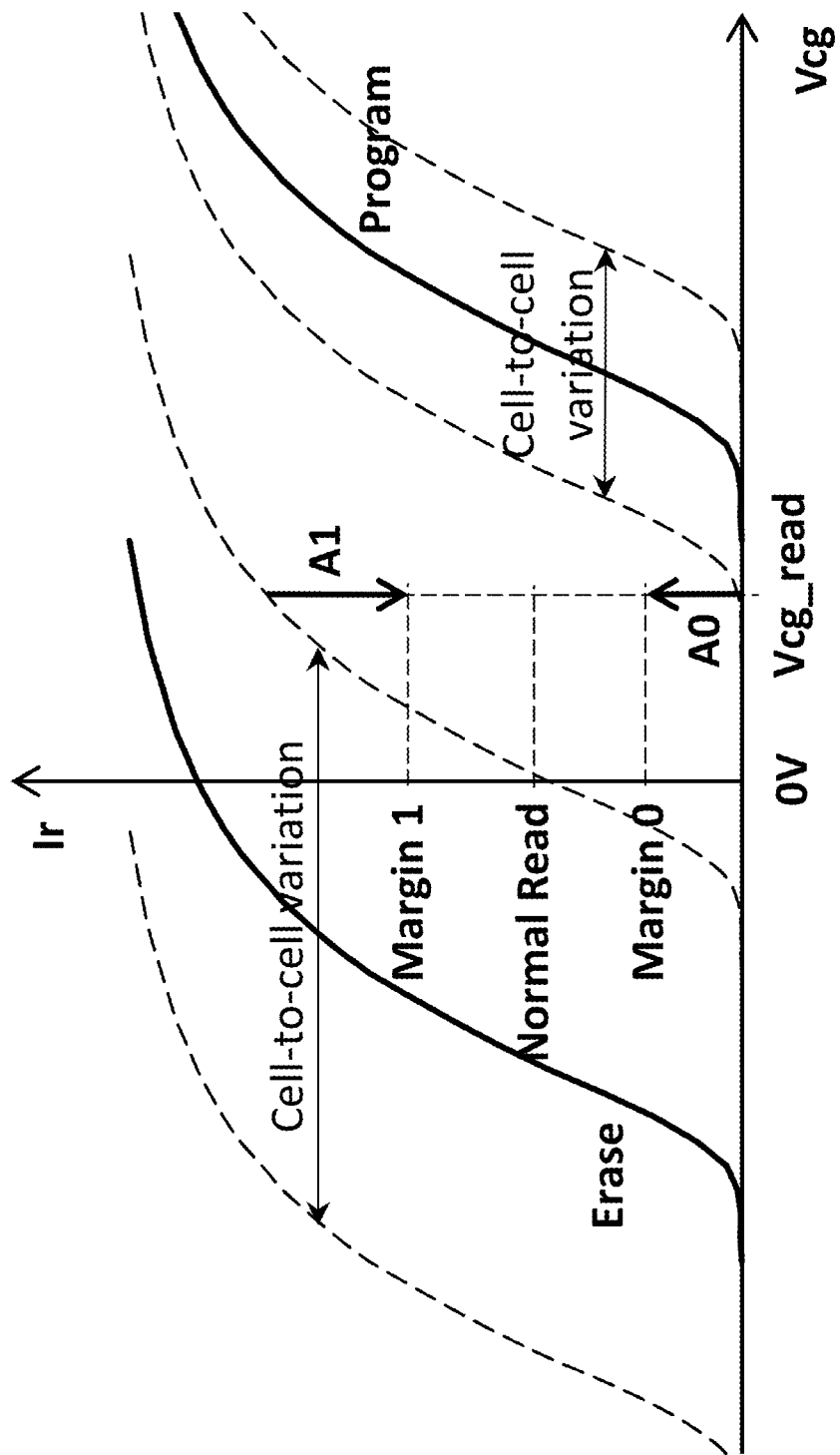
FIG. 4 is a graph showing distributions of read currents as a function of control gate voltage for memory cells in different program states.

One criterion for selecting the margin levels can be to provide a guardband to account for the cell-to-cell variation of read currents of normal (non-defective) programmed and erased memory cells in the array, which are illustrated in FIG. 4. Using the nominal read voltage Vcg_read on the control gate during the read operation, the lowest read current Ir after the erase operation in the memory array is greater than Margin 1 by an amount A1, and the highest read current Ir after the program operation is less than Margin 0 by an amount A0, as respectively illustrated by arrows A1 and A0 in FIG. 4. The guardband can prevent screening out good memory cells from the tail of intrinsic variations. As illustrated in FIG. 4, the cell-to-cell variation after the erase operation is wider than that after the program operation.

Figure 5:
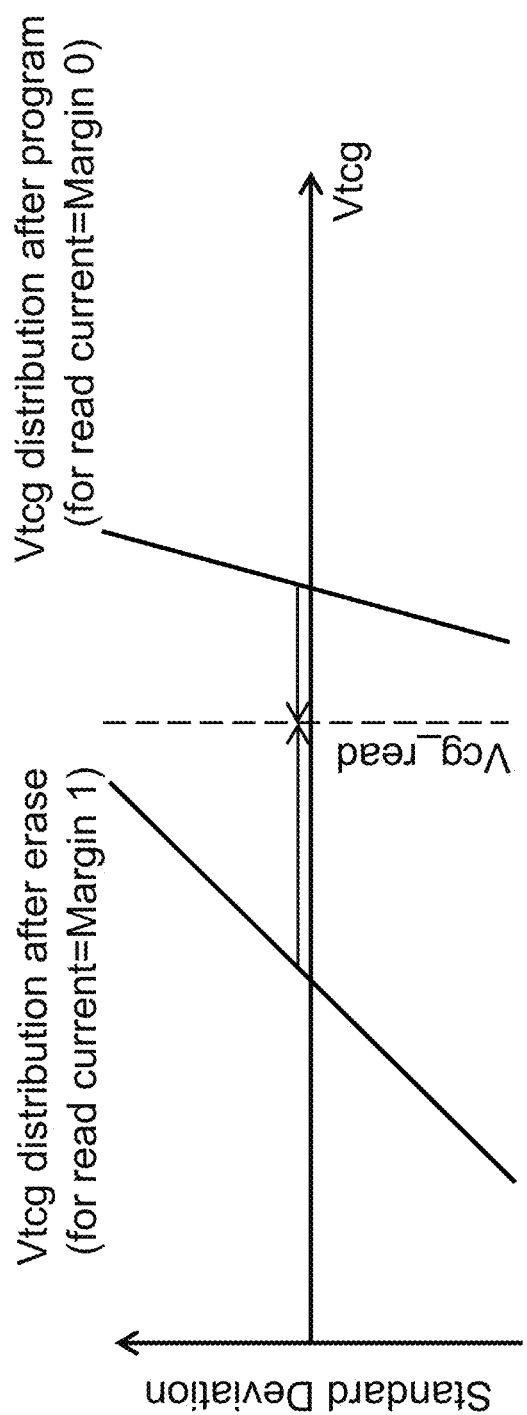
FIG. 5 is a graph showing standard deviation distributions of threshold voltages for memory cells in different program states.

FIG. 5 schematically illustrates memory cell array threshold voltage (Vtcg) distributions after erase and program operations. Cell threshold voltage Vtcg is the minimum read voltage applied to the control gate needed to produce a certain level of read current (e.g., Margin 0, Normal Read, Margin 1) through the memory cell during the read operation. The Vtcg distribution after erase in FIG. 5 corresponds to control gate read voltage required for the cell current to match the Margin 1 read current threshold. The Vtcg distribution after program in FIG. 5 corresponds to control gate read voltage required for cell current to match the Margin 0 read current threshold. Vtcg equal to Vcg_read in FIG. 5 corresponds to the read reference current used to differentiate erased memory cells from programmed memory cells during nominal read operations. Margin 1 and Margin 0 read current thresholds are set for data retention screening defective memory cells so as to be outside of the intrinsic distributions of the erase and program states respectively. Since Vtcg distributions after erase are wider than that after program, the data retention screening efficiency is lower (i.e., time-to-failure is longer) for leaky memory cells in the erase state compared to in the program state because electron leakage occurs over time.

The inventors have realized that the data retention screening from the erased state '1' can be enhanced by compacting the erase distribution of the erased memory cells (i.e., the distribution of threshold voltages for Margin 1), which is achieved by applying a weak programming operation after the erase operation so that the memory cells are in a modified (i.e., compacted) erased state. Once the modified (compacted) erase state is achieved, the margin read current threshold (Margin 1) can be set closer to the center of erase state '1' distribution, thus improving data retention screening efficiency (i.e., reducing time-to-failure for leaky memory cells which are likely to originate from the center of the distribution). The Vtcg distribution can be compacted by applying several weak program operations with gradually incremented programming voltage, and performing a read verify operation between the weak program operations. As explained in further detail below, additional techniques can be used in combination with the weak programming operation to identify defective leaky memory cells, which are explained in more detail below. For example, to reduce yield loss caused by limited intrinsic negative Ir shift (or positive Vtcg shift) during the high temperature bake, which is not related to defective leakage from the floating gate, a lower Vcg_read operation can be performed before the bake operation compared to a higher Vcg_read after bake. Another technique, to compensate for intrinsic Ir shift during the bake operation, is to use a higher Margin 1 level before the bake operation compared to a lower Margin 1 level after the bake operation. As another technique, to further enhance the data retention screening for leaky memory cell detection, a stronger erase operation (compared to nominal erase operation) can be applied first to push the final compacted erase distribution further away from the neutral charge state. As yet another technique, Vcg_read to verify the strong erase operation can be set lower than the Vcg_read after the erase distribution is compacted by the weak program operation. As one more technique, a higher Margin 1 level for the read operation after the erase operation can be used compared to Margin 1 level for the read operation after the weak program operation.

Figure 6:
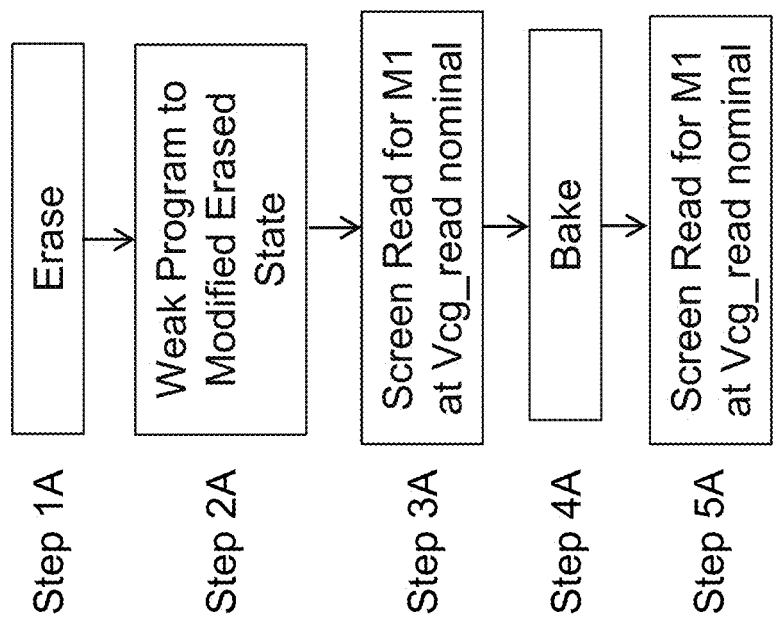
FIG. 6 is a flow diagram showing the operational steps of a first example of memory cell screening.
Figure 7:
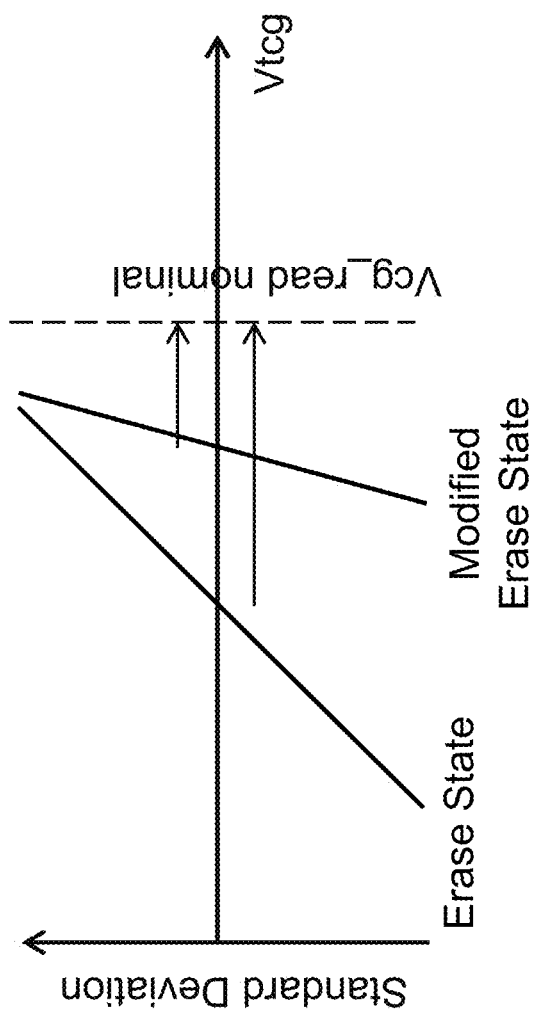
FIG. 7 is a graph showing standard deviation distributions of threshold voltages for memory cells in different program states according to the first example of FIG. 6.
Figure 8:
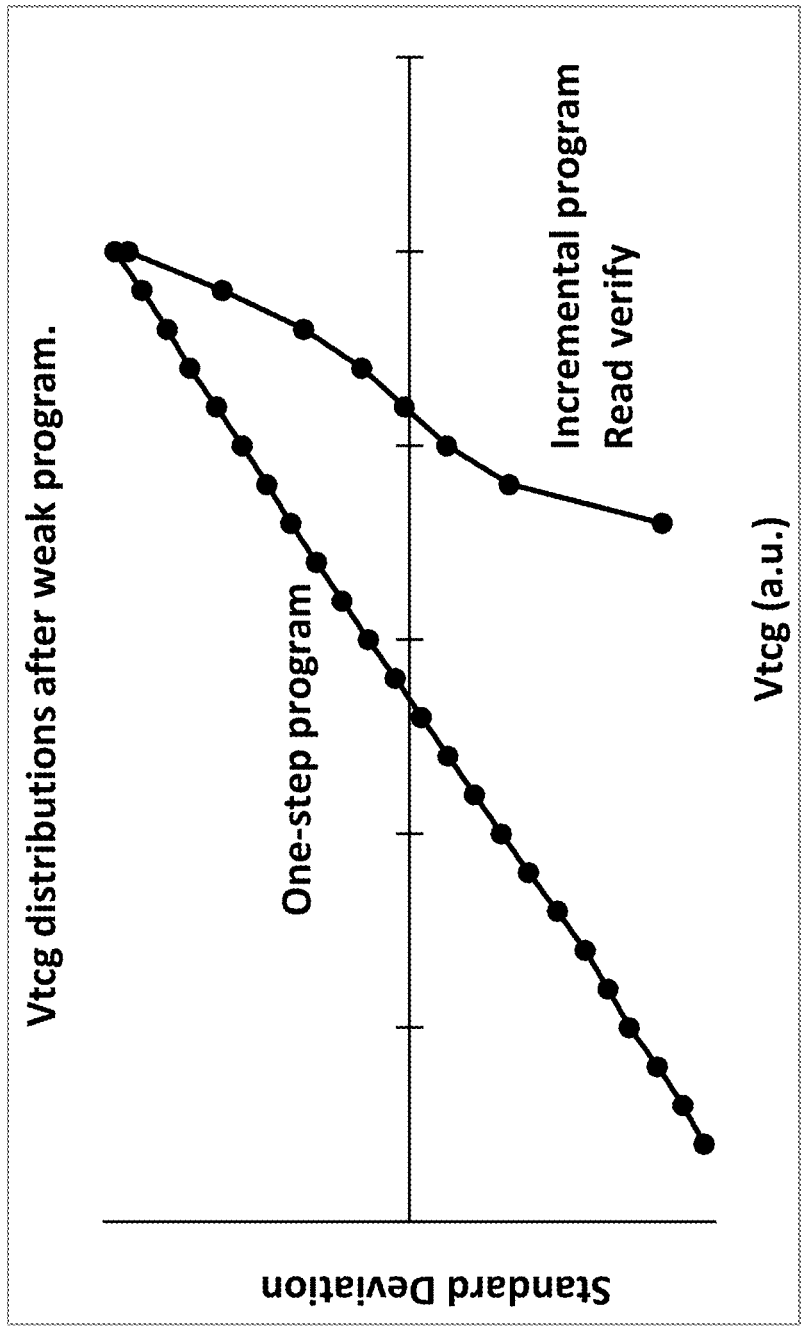
FIG. 8 is a graph showing standard deviation distributions of threshold voltages for memory cells in modified erased states.

FIGS. 6-8 illustrate a first method, where the data retention screening includes compacting the distribution of threshold voltages Vtcg for erased memory cells by performing a weak program operation on erased memory cells. As shown in FIG. 6, for step 1A of this example, the memory cells are erased using a nominal erase operation. In step 2A, the memory cells are weakly programmed using a weak program operation to compact the distribution of threshold voltages Vcg for the memory cells. After the weak program operation, the memory cells are in a modified erased state. FIG. 7 illustrates the threshold voltage distribution after the erase operation (line labeled "Erase State"), and the more compact threshold voltage distribution after the weak program operation (line labeled "Modified Erase State"). In order to compact the erase distribution, one can apply a weak program, the conditions of which are selected to keep the shift of the higher standard deviation portion of the erase distribution low while causing larger shifts of median and lower portions of the standard deviation erase distribution, whereby the memory cells in the modified erased state are still below the threshold voltage Vcg associated with nominal operations and still exhibit a high enough read current during a nominal read operation so that the memory cells in the modified erase state are still considered erased (i.e., the goal is not to over-program the memory cells so that cell current remains above Margin 1 level). A one-operation weak program operation can noticeably tighten the erase distribution as shown in FIG. 7. In step 3A, a first screen read is performed, where the memory cells are read in a first read operation using the nominal read operation Vcg_read voltage on the control gate (also referred to herein as the nominal read voltage Vcg_read, the nominal read voltage for the control gate, Vcg_read nominal, and with respect to this example a first read voltage), whereby any memory cells with a read current below the margin read current threshold M1 are screened out as defective. As discussed above, the margin read current threshold M1 is greater than the read reference current that a memory cell exhibits in a nominal read operation to be considered erased. As used herein, screen or screening refers to identifying any memory cells with a read current below the margin read current threshold M1 as defective, and screen read refers to the combination of a read operation and the identifying of any memory cells as defective using the results of the read operation. In step 4A, a high temperature bake operation is then performed (e.g., 250 degrees Celsius for three days). In step 5A, a second screen read is performed, where the memory cells are read in a second read operation using Vcg_read nominal on the control gate, whereby any memory cells with a read current below margin read current threshold M1 are screened out as defective.

As shown in FIG. 8, the erase distribution of threshold voltages Vtcg can be further tightened by applying a weak program algorithm that uses pulses of program voltages, separated by read verify operations, where one or more program voltages are gradually incremented pulse by pulse, with read verify operations between the pulses, until the modified erase state is achieved. The programming voltage increment can be selected based on sort time budget and duration of programming time per increment. The benefit of applying the programming algorithm with smaller voltage increments is that more compacted distributions can be achieved. However, it can take a longer time for programming, and thus, optimization or tradeoff between distribution tightness and increasing testing time is contemplated in determining whether a single pulse weak program operation or a multi-pulse weak program operation should be used to achieve the desired modified erase states for the memory cells.

Figure 9:
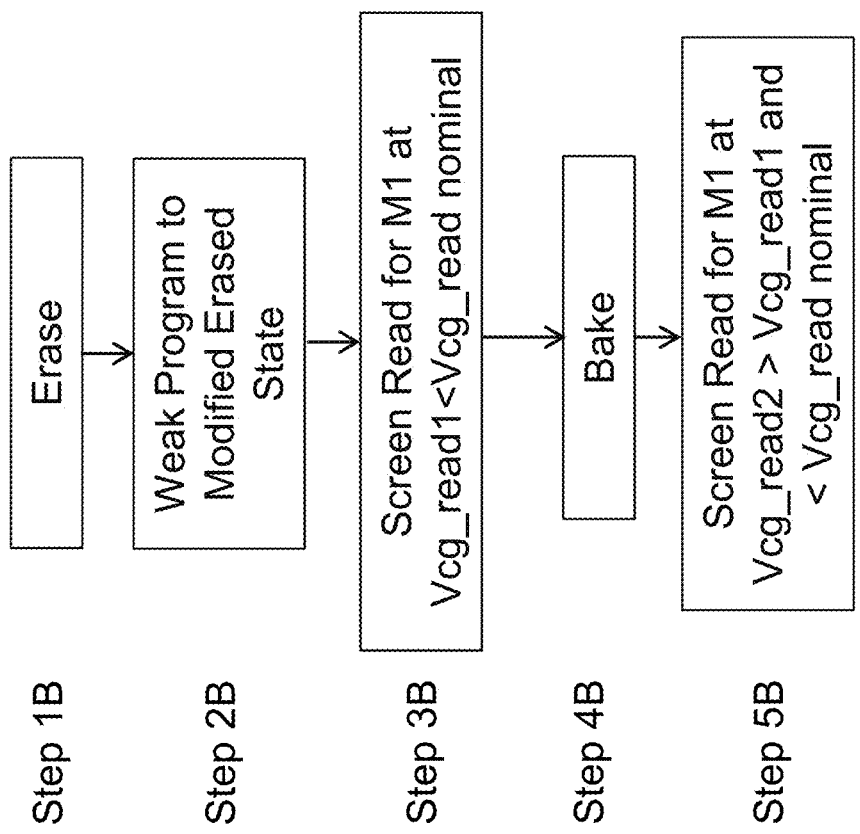
FIG. 9 is a flow diagram showing the operational steps of a second example of memory cell screening.
Figure 10:
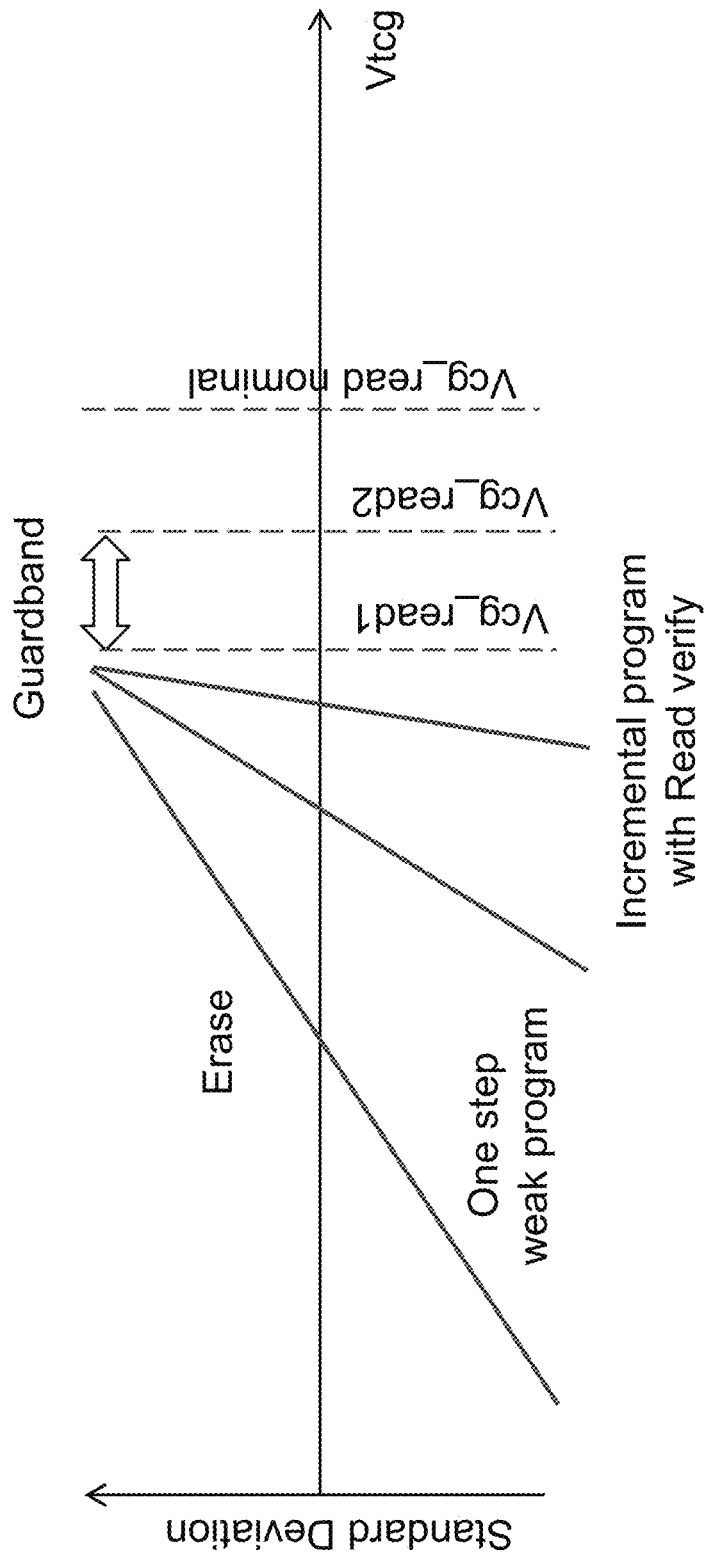
FIG. 10 is a graph showing standard deviation distributions of threshold voltages for memory cells in different program states according to the second example of FIG. 9.
Figure 11:
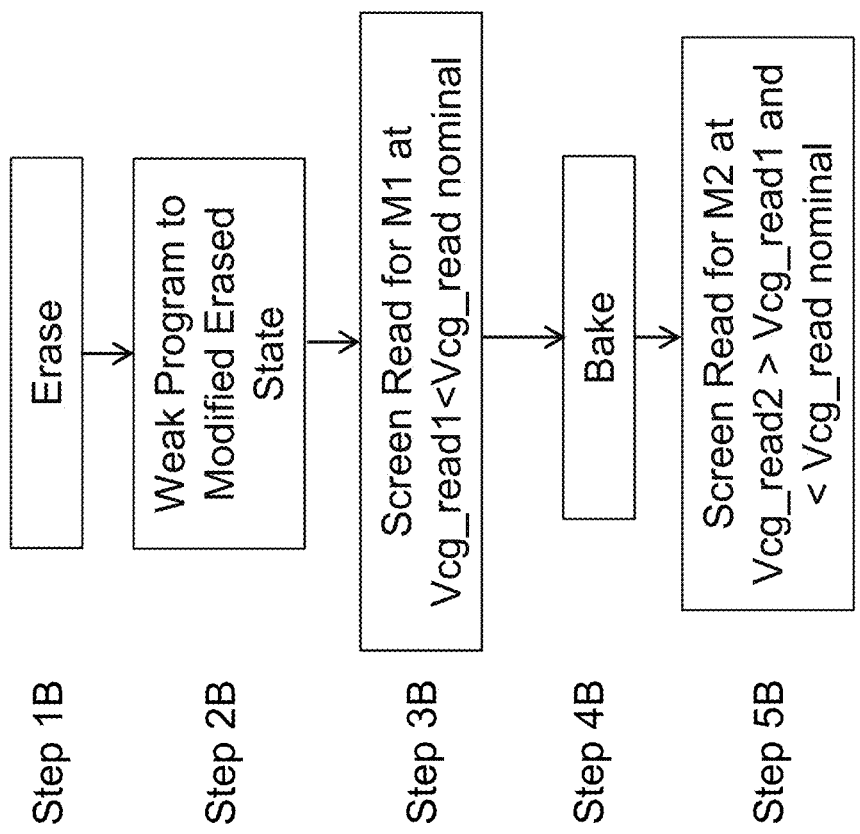
FIG. 11 is another flow diagram showing the operational steps of the second example of memory cell screening.

FIGS. 9-10 illustrate a second method, where the data retention screening uses different read operation conditions both before and after the bake operation, relative to nominal read operations. After the erase operation of the step 1B and the weak program operation of step 2B to place the memory cells in a modified erased state (where an incremental program with read verify can provide a more condensed standard deviation distribution compared to a one step weak program), a first screen read is performed in step 3B in which a first read operation is performed using a read voltage on the control gate Vcg_read1 (also referred to with respect to this example as a first read voltage) that is less than Vcg_read nominal, whereby any memory cells with a read current below the margin read current threshold M1 are screened out as defective. In step 4B, a high temperature bake operation is then performed (e.g., 250 degrees Celsius for three days). In step 5B, a second screen read is performed, where the memory cells are read in a second read operation using a read voltage on the control gate Vcg_read2 (also referred to with respect to this example as a second read voltage) which is greater than Vcg_read1 and less than Vcg_read nominal, whereby any memory cells with a read current below margin read current threshold M1 are screened out as defective. This example is advantageous because the weak program conditions can be selected to increase the shift of the center of the erase distribution more than the upper edge of the standard deviation distribution with the highest Vtcg, which should be minimally shifted. The guardband provided between Vcg_read1 and Vcg_read2 accounts for intrinsic read current shift mechanisms which are not related to charge leakage from the floating gate through defects during the bake operation. Instead of, or in addition to, increasing the voltage applied to the control gate in the second screen read relative to the first screen read as described above, a second margin read current threshold M2 for the second screen read could be less than the first margin read current threshold M1 for the first screen read, but still greater than the read reference current. If it is in addition to, then in Step 5B of FIG. 9, the second margin read current threshold M2 is used for the screen read instead of the first margin read current threshold M1, as shown in FIG. 11.

Figure 12:
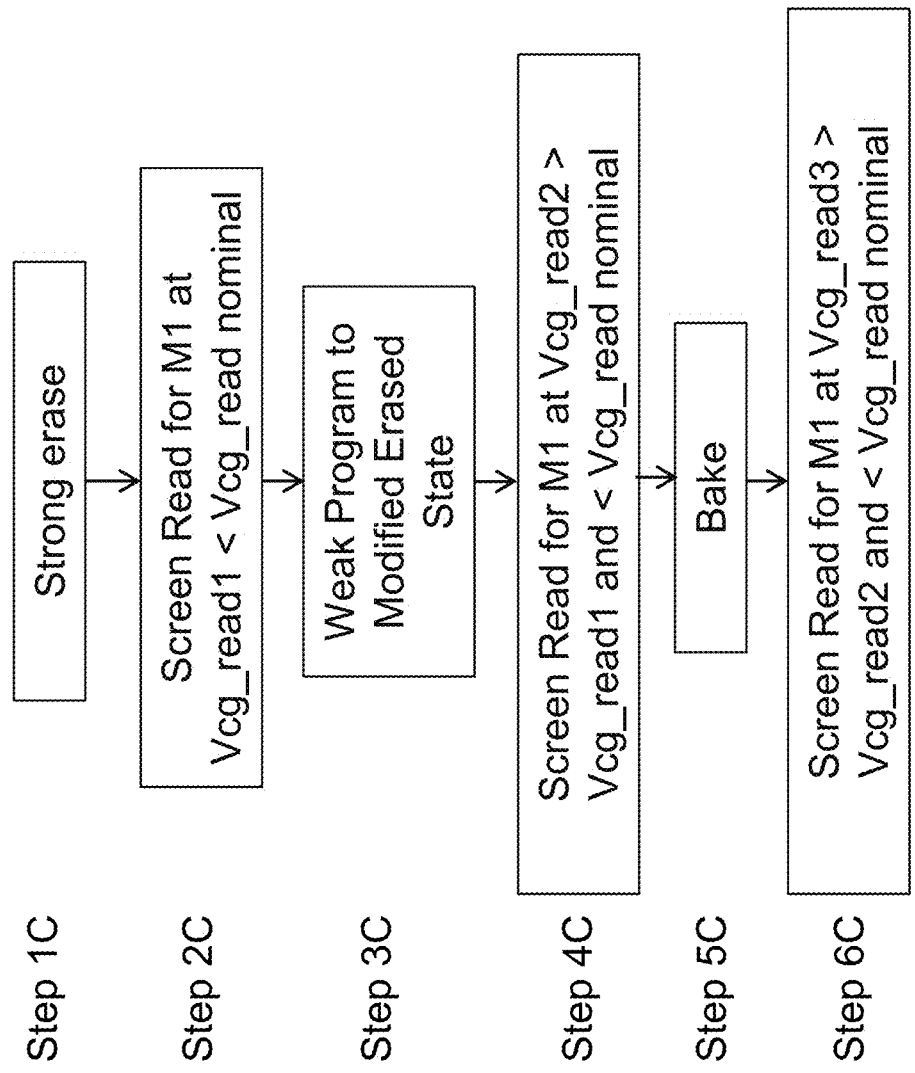
FIG. 12 is a flow diagram showing the operational steps of a third example of memory cell screening.
Figure 13:
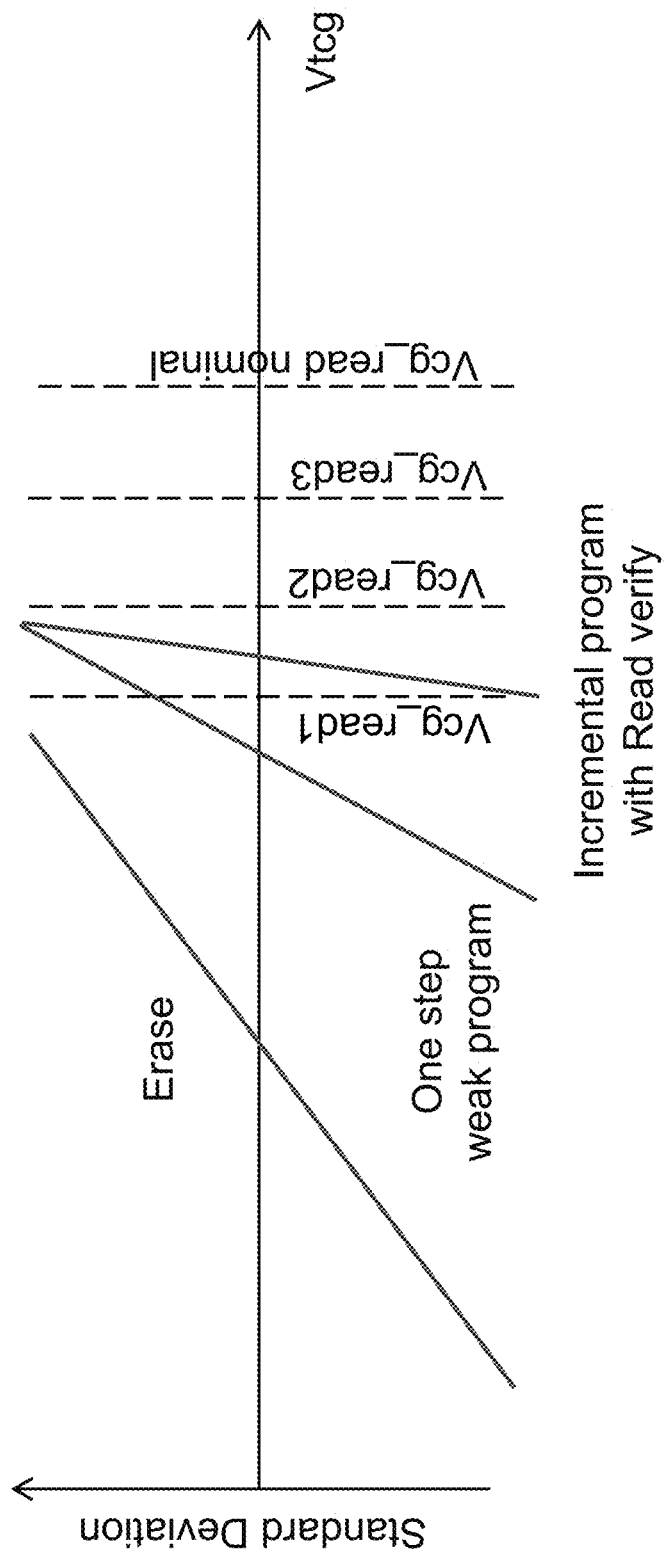
FIG. 13 is a graph showing standard deviation distributions of threshold voltages for memory cells in different program states according to the third example of FIG. 12.
Figure 14:
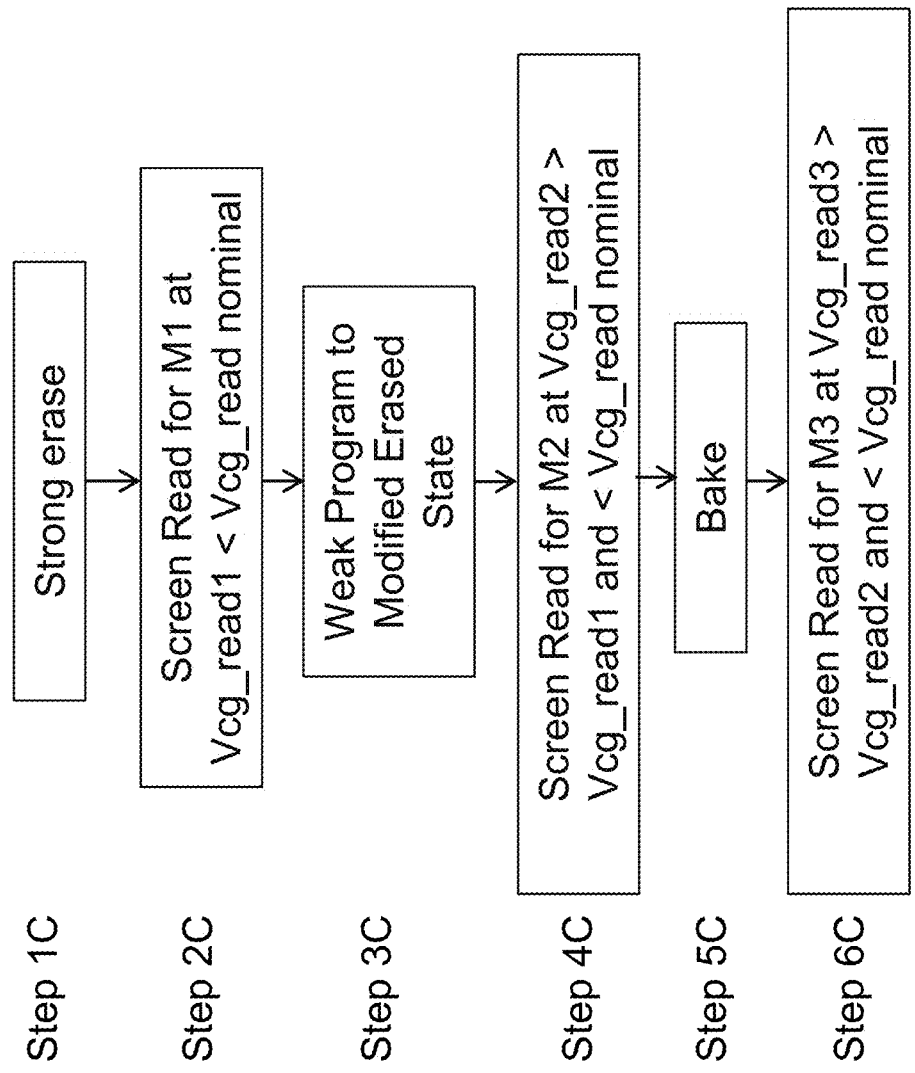
FIG. 14 is another flow diagram showing the operational steps of the third example of memory cell screening.

FIGS. 12-13 illustrate a third method, where the data retention screen includes three read operations. In step 1C, the memory cells are erased using a strong erase operation, which means the erase voltage applied to the erase gate is higher than the voltage applied during nominal erase operations, is applied for a longer period of time than in nominal erase operations, or both, so that the memory cells are more deeply erased than during nominal erase operations. In step 2C, a first screen read is performed in which a first read operation is performed using a read voltage on the control gate Vcg_read1 (also referred to with respect to this example as a first read voltage) that is less Vcg_read nominal, and any memory cells with a read current below the margin read current threshold M1 are screened out as defective. In step 3C, a weak programming operation is performed to place the memory cells in a modified erased state. In step 4C, a second screen read is performed, where the memory cells are read in a second read operation using a read voltage on the control gate Vcg_read2 (also referred to with respect to this example as a second read voltage) which is greater than Vcg_read1 and less than Vcg_read nominal, and any memory cells with a read current below margin read current threshold M1 are screened out as defective. In step 5C, a high temperature bake operation is then performed (e.g., 250 degrees Celsius for three days). In step 6C, a third screen read is performed, where the memory cells are read in a third read operation using a read voltage on the control gate Vcg_read3 (also referred to with respect to this example as a third read voltage) which is greater than Vcg_read2 and less than Vcg_read nominal, and any memory cells with a read current below margin read current threshold M1 are screened out as defective. In this example, the deep erase and the application of the first screen read before the weak program helps account for any possible overshooting during the weak program. Instead of, or in addition to, increasing the voltage applied to the control gate in the successive first, second and third screen reads as described above, the margin read current threshold M1 for the successive first, second and third screen reads could be successively lower. For example, a second margin read current threshold M2 for the second screen read could be less than the first margin read current threshold M1 for the first screen read, and a third margin read current threshold M3 for the third screen read could be less than the second margin read current threshold M2 for the second screen read, where all three margin read current thresholds M1, M2, M3 are still greater than the read reference current. If it is in addition to, then in Step 4C of FIG. 12, the second margin read current threshold M2 is used for the screen read instead of the first margin read current threshold M1, and in Step 6C of FIG. 12, the third margin read current threshold M3 is used for the screen read instead of the first margin read current threshold M1, as shown in FIG. 14.

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims.

What is claimed is:

1. A method for screening memory cells, comprising:
erasing the memory cells;
weakly programming the memory cells to a modified erased state;
performing a first read operation on the memory cells after the erasing and the weakly programming;
screening any of the memory cells that exhibit a read current during the first read operation below a margin read current threshold M1;
baking the memory cells after the first read operation;
performing a second read operation on the memory cells after the baking; and
screening any of the memory cells that exhibit a read current during the second read operation below the margin read current threshold M1.

2. The method of claim 1, wherein the margin read current threshold M1 is greater than a read reference current used to determine an erased state of the memory cells during a nominal read operation.

3. The method of claim 1, wherein:
each of the memory cells includes a control gate;
the performing of the first read operation includes applying a first read voltage to the control gates that is equal to a nominal read voltage for the control gates; and
the performing of the second read operation includes applying the first read voltage to the control gates.

4. The method of claim 1, wherein:
each of the memory cells includes a control gate;
the performing of the first read operation includes applying a first read voltage to the control gates that is less than a nominal read voltage for the control gates; and
the performing of the second read operation includes applying a second read voltage to the control gates that is less than the nominal read voltage for the control gates and greater than the first read voltage.

5. A method for screening memory cells, comprising:
erasing the memory cells;
weakly programming the memory cells to a modified erased state;
performing a first read operation on the memory cells after the erasing and the weakly programming;
screening any of the memory cells that exhibit a read current during the first read operation below a margin read current threshold M1;
baking the memory cells after the first read operation;
performing a second read operation on the memory cells after the baking; and
screening any of the memory cells that exhibit a read current during the second read operation below a margin read current threshold M2;
wherein the margin read current thresholds M1 and M2 are greater than a read reference current used to determine an erased state of the memory cells during a nominal read operation, and the margin read current threshold M2 is less than the margin read current threshold M1.

6. The method of claim 5, wherein:
each of the memory cells includes a control gate;
the performing of the first read operation includes applying a first read voltage to the control gates that is less than a nominal read voltage for the control gates; and
the performing of the second read operation includes applying a second read voltage to the control gates that is less than the nominal read voltage for the control gates and greater than the first read voltage.

7. A method for screening memory cells, comprising:
strongly erasing the memory cells, wherein each of the memory cells includes a control gate;
performing a first read operation on the memory cells, after the strongly erasing, that includes applying a first read voltage to the control gates that is below a nominal read voltage for the control gates;
screening any of the memory cells that exhibit a read current during the first read operation below a margin read current threshold M1;
weakly programming the memory cells to a modified erased state;
performing a second read operation on the memory cells, after the weakly programming, that includes applying a second read voltage to the control gates that is below a nominal read voltage for the control gates and greater than the first read voltage;
screening any of the memory cells that exhibit a read current during the second read operation below the margin read current threshold M1;
baking the memory cells after the second read operation;

performing a third read operation on the memory cells, after the baking, that includes applying a third read voltage to the control gates that is below the nominal read voltage for the control gates and greater than the second read voltage; and screening any of the memory cells that exhibit a read current during the third read operation below the margin read current threshold M1.

8. The method of claim 7, wherein the margin read current threshold M1 is greater than a read reference current used to determine an erased state of the memory cells during a nominal read operation.

9. A method for screening memory cells, comprising:

strongly erasing the memory cells, wherein each of the memory cells includes a control gate;

performing a first read operation on the memory cells, after the strongly erasing, that includes applying a first read voltage to the control gates that is below a nominal read voltage for the control gates;

screening any of the memory cells that exhibit a read current during the first read operation below a margin read current threshold M1;

weakly programming the memory cells to a modified erased state;

performing a second read operation on the memory cells, after the weakly programming, that includes applying a second read voltage to the control gates that is below a nominal read voltage for the control gates and greater than the first read voltage;

screening any of the memory cells that exhibit a read current during the second read operation below a margin read current threshold M2;

baking the memory cells after the second read operation;

performing a third read operation on the memory cells, after the baking, that includes applying a third read voltage to the control gates that is below the nominal read voltage for the control gates and greater than the second read voltage; and screening any of the memory cells that exhibit a read current during the third read operation below a margin read current threshold M3;

wherein the margin read current thresholds M1, M2 and M3 are greater than a read reference current used to determine an erased state of the memory cells during a nominal read operation, the margin read current threshold M3 is less than the margin read current threshold M2, and the margin read current threshold M2 is less than the margin read current threshold M1.

* * * * *